(12) United States Patent
Bouny et al.

(10) Patent No.: US 7,639,083 B2
(45) Date of Patent: Dec. 29, 2009

(54) COMPENSATION FOR PARASITIC COUPLING BETWEEN RF OR MICROWAVE TRANSISTORS IN THE SAME PACKAGE

(75) Inventors: Jean Jacques Bouny, Fontenilles (FR); Pascal Peyrot, Frouzins (FR)

(73) Assignee: Freescale Semiconductor, Inc., Austin, TX (US)

( * ) Notice: Subject to any disclaimer, the term of this patent is extended or adjusted under 35 U.S.C. 154(b) by 161 days.

(21) Appl. No.: 11/994,760

(22) PCT Filed: Jul. 5, 2005

(86) PCT No.: PCT/EP2005/010044

§ 371 (c)(1),
(2), (4) Date: Jan. 4, 2008

(87) PCT Pub. No.: WO2007/003224

PCT Pub. Date: Jan. 11, 2007

(65) Prior Publication Data

US 2008/0224771 A1   Sep. 18, 2008

(51) Int. Cl.
*H03F 1/14* (2006.01)
(52) U.S. Cl. .......................... 330/292; 330/302; 330/53
(58) Field of Classification Search .................. 330/292, 330/302, 53
See application file for complete search history.

(56) References Cited

U.S. PATENT DOCUMENTS

| 5,066,925 | A | | 11/1991 | Freitag et al. | |
|---|---|---|---|---|---|
| 5,159,204 | A | * | 10/1992 | Bernacchi et al. | 327/439 |
| 5,778,303 | A | * | 7/1998 | Shinozaki et al. | 348/143 |
| 6,011,438 | A | * | 1/2000 | Kakuta et al. | 330/262 |
| 6,140,873 | A | * | 10/2000 | Van Groningen | 330/10 |
| 6,734,728 | B1 | | 5/2004 | Leighton et al. | |
| 6,768,381 | B2 | * | 7/2004 | Kuriyama | 330/295 |
| 7,368,986 | B2 | * | 5/2008 | Pillonnet | 330/10 |
| 2003/0117219 | A1 | | 6/2003 | Yamamoto et al. | |

OTHER PUBLICATIONS

Takenaka et al; "L/S-band 140 W push-pull power AlGaAs/GaAs HFETs for digital cellular base stations" Gallium Arsenide Integrated Circuit Symposium 1998, pp. 81-85.
Takenaka et al; "A 240 W Doherty GaAs power FET amplifier with high efficiency and low distortion for W-CDMA base stations"; Microwave Symposium Digest 2004, pp. 525-528.

* cited by examiner

*Primary Examiner*—Patricia Nguyen

(57) ABSTRACT

Parasitic coupling effects between RF or microwave transistors provided in a common package are compensated by connecting one or more capacitors between the transistors. By connecting the capacitor(s) at a location that corresponds to the site of the coupling, the compensation is effective over a wide frequency band. This coupling-compensation makes it feasible to provide, in a common package, RF or microwave transistors intended to operate in quadrature, thereby improving performance matching and operating efficiency of the overall device.

19 Claims, 1 Drawing Sheet

COMPENSATION FOR PARASITIC COUPLING BETWEEN RF OR MICROWAVE TRANSISTORS IN THE SAME PACKAGE

The present invention relates to the field of amplifiers, especially radio frequency (RF) and microwave amplifiers, notably of the type used in telecommunications' systems.

In the present document, the expression "RF transistor" has its usual meaning and, in particular, denotes a transistor having a current gain bandwidth product ($f_T$) equal to or greater than about 1 GHz and less than or equal to about 20 GHz, and the expression "microwave transistor" has its usual meaning and, in particular, denotes a transistor having a current gain bandwidth product ($f_T$) equal to or greater than about 5 GHz and less than or equal to about 50 GHz.

In conventional balanced amplifiers, or the newer Doherty amplifiers, it is necessary to use two transistors in quadrature, that is, two transistors handling signals with a phase difference of 90° between them. The efficiency of such amplifiers would be improved if the two transistors had matched performance (in terms of gain, output power, etc.).

A similar need for matched performance exists in the case where transistors handle respective signals with a 180° phase difference between them, in a so-called "push-pull" configuration, and in that case a solution consists in providing both transistors in a common package (so as to avoid performance variations attributable to differences in the manufacturing process). However, up to now this solution has not been workable for RF and microwave transistors operating in quadrature, for the reason explained below.

When two RF transistors (or two microwave transistors) are provided in a common package there will generally be a parasitic coupling between them, for example a coupling between their connecting wires, between the elements (such as tuning networks), that are intimately associated with them, etc.

If the two RF (or microwave) transistors are in a parallel combined configuration (0° phase), then the coupling is in phase with the signals flowing through the transistors and so has almost no effect (if the parasitic coupling is indeed between the lead wires then it will lead to a small change in the inductance value of the wire bonding). If the two RF (or microwave) transistors are combined at 180° (push-pull configuration), this parasitic coupling is in anti-phase with the signal flowing through the transistors and it has the same effect on both sides of the push-pull (the parasitic coupling effects at +180° at one transistor equate to the parasitic coupling effects at −180° at the other transistor).

However, in the case where the two RF (or microwave) transistors are combined at 90° (in quadrature), one transistor will see effects of the parasitic coupling at +90°, whereas the other transistor will see effects at −90°, leading to different effects on the two transistors. As a result, the two RF (or microwave) transistors have different gains, different output power, different efficiencies, etc., and there is an asymmetry in heat dissipation.

The above-described problem is illustrated by the graph of FIG. 1A, which shows how RF or microwave transistor gain varies with output power for each of two transistors that are combined at 90° and provided in a common package. It can be seen from FIG. 1A that there is a substantial difference in gain between the two transistors.

The above problems are already significant in the case of pairs of RF or microwave transistors operating in quadrature in conventional balanced amplifiers, e.g. in a regular class-AB amplifier. However, the newer Doherty amplifiers have increased sensitivity to variations and imbalances between the two sides of the amplifier. Thus, it is particularly important to have matched RF or microwave transistor pairs in Doherty amplifiers.

In view of the above-described problem, conventionally, RF transistors (and microwave transistors) that are to operate in quadrature are provided in separate packages. However, this is disadvantageous because it increases the size and cost of the overall device in which the transistors are used, and makes the process of designing the device more complicated. Moreover, variations in the manufacturing process used to form the two separate packages can lead to differences in the performances of the two transistors, adversely affecting efficiency of the overall device and leading to undesirable results. For example, in the case of an RF amplifier used in the base station of a mobile telecommunications network, this loss in efficiency of the RF amplifier leads to an increase in the current consumption of the amplifier and to increased requirements for cooling (leading to use of a physically-larger cooling system).

The present invention provides a method of compensating for parasitic coupling between a pair of RF or microwave transistors in the same package, as defined in the accompanying claims.

The present invention further provides a packaged electronic device as defined in the accompanying claims.

The present invention yet further provides an amplifier device as defined in the accompanying claims.

Because the preferred embodiments of the invention provide a method of compensating for the parasitic coupling that arises between a pair of RF transistors (or a pair of microwave transistors) that are provided in a common package and operating in quadrature, it becomes feasible to provide such transistors in a common package. This makes it easier to design the overall device, and leads to a reduction in the size and cost of the circuitry and to improved matching of transistor performance.

The improved matching of transistor performance leads to increased efficiency of operation. In an RF amplifier used in the base station of a mobile telecommunications system, this improvement in efficiency leads to reductions in the set-up costs and operating costs of the base station: set-up costs are reduced because of the ability to use a smaller cooling system and operating costs are reduced because of the lower current consumption of the amplifier. Moreover, because the base station equipment can be run at a lower temperature, the lifetime of the equipment can be extended.

The above and further features, particularities and advantages of the present invention will become clearer from the following description of a preferred embodiment thereof, given by way of example, illustrated by the accompanying drawings, in which:

FIG. 1 shows how RF or microwave transistor gain varies with output power for transistors combined at 90° and located in a common package, in which:

After extensive studies the present inventors have determined that the main parasitic coupling that exists between RF transistors (and between microwave transistors) when they are provided in a common package is a magnetic coupling, notably an inductive coupling (mutual inductance), between the wire areas of the transistors. The precise configuration of the wire areas of an RF or microwave transistor may vary, for example depending on the elements (such as tuning networks, or input/output prematch cells) that are associated with the transistor. Thus, the precise location at which the mutual inductance manifests itself may vary.

According to the preferred embodiment of the present invention, the above-mentioned parasitic coupling is compensated by adding a small capacitance between the RF transistors (or microwave transistors). It is advantageous to provide the compensating capacitance at the location where the inductive coupling is taking place, thus providing a wideband solution.

Figure 2:
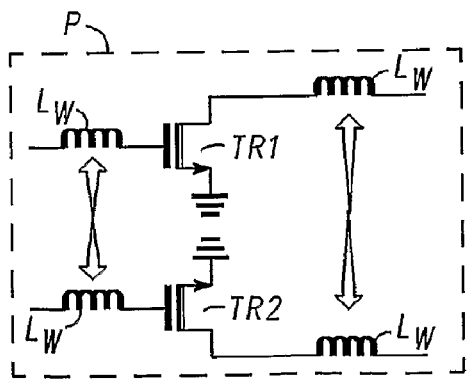
FIG. 2 is a simplified diagram illustrating one example of parasitic coupling between two RF or microwave transistors operating in quadrature (combined at 90°)

Parasitic coupling is illustrated diagrammatically in FIG. 2 which shows one example of a typical circuit arrangement involving a pair of transistors, which may be a pair of RF transistors or a pair of microwave transistors.

FIG. 2 illustrates two transistors, TR1 and TR2, provided in a single package, P. The transistors TR1 and TR2 are combined at 90° as part of an RF amplifier, multi-way amplifier or microwave amplifier. As mentioned above, the main parasitic coupling between the transistors TR1 and TR2 is a mutual inductance arising due to the wiring areas of the transistor. In the case illustrated in FIG. 2, the main coupling between the transistors TR1 and TR2 is between the input and output bonding wires, that is the wires used to bond the RF transistors to external leads. This mutual inductance is represented in FIG. 2 by means of double-headed arrows directed at notional inductors $L_W$ each representing the inductance of a respective bonding wire. The inductance of each bonding wire may be of the order of 1 nH, giving rise to a mutual inductance of around 100 pH between the input bonding wires, and between the output bonding wires.

Figure 3:
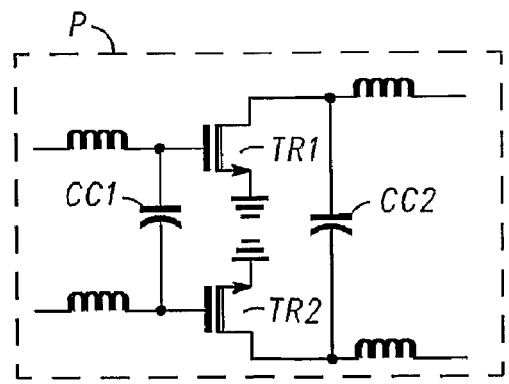
FIG. 3 is a simplified diagram illustrating a technique according to a preferred embodiment of the invention for compensating the parasitic coupling that exists between the two RF or microwave transistors in the example of FIG. 2.

FIG. 3 illustrates the coupling-compensation method according to a preferred embodiment of the present invention. FIG. 3 illustrates the case where parasitic coupling is being compensated in a circuit arrangement based on FIG. 2 involving a pair of RF transistors or a pair of microwave transistors.

In the example shown in FIG. 3 a first compensating capacitor, CC1, is connected between the input bonding wire of the first transistor, TR1, and the input bonding wire of the second transistor, TR2. A second compensating capacitor, CC2, is connected between the output bonding wire of the first transistor, TR1, and the output bonding wire of the second transistor, TR2. The compensating capacitor CC1 prevents the parasitic coupling between the input bonding wires from causing an undesired current to flow in the input bonding wires. The compensating capacitor CC2 prevents the parasitic coupling between the output bonding wires from causing an undesired current to flow in the output bonding wires. For a circuit having the inductance and mutual inductance values given above with reference to FIG. 2, it would be appropriate to use compensating capacitors each having a capacitance of a few pF.

Figure 1A:
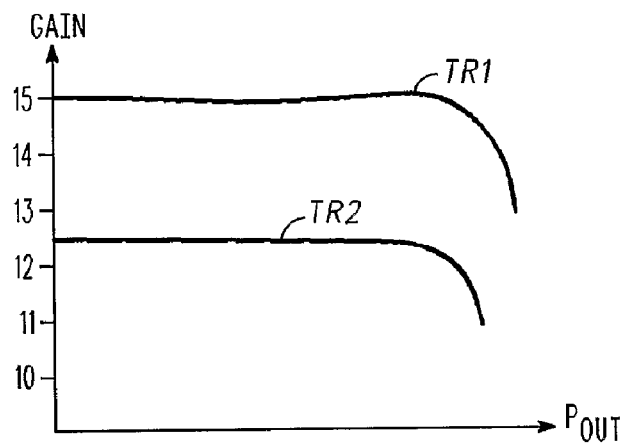
FIG. 1A illustrates the case of RF or microwave transistors subject to parasitic coupling.
Figure 1B:
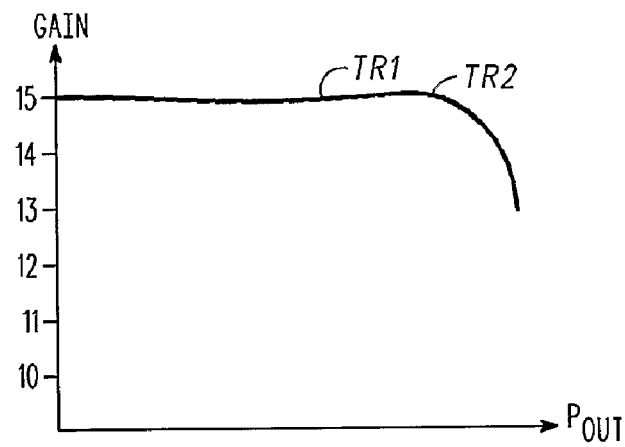
FIG. 1B illustrates the case of RF or microwave transistors for which parasitic coupling is compensated according to a preferred embodiment of the invention.

Because the parasitic coupling between the transistors TR1 and TR2 is compensated, the performance of the transistors becomes better matched: for example, the respective gains of the two transistors become more nearly equal to each other. This effect is illustrated in FIG. 1B.

The parasitic-coupling compensation technique according to the preferred embodiment of the present invention is simple and inexpensive to implement. Moreover, because the compensating capacitors CC1 and CC2 are provided at the locations where the mutual inductance is exerting an influence, they are effective to compensate for parasitic coupling over a wide range of frequencies.

It should be noted that the adoption of the compensation technique according to the preferred embodiment of the present invention does not preclude use of the transistor pair of FIG. 3 in a parallel configuration (0° phase difference) or in a push-pull configuration (180° phase difference). Thus, a packaged electronic component embodying the compensation technique according to the preferred embodiment is versatile, even though it has been designed specially to permit operation of the transistors at 90°.

In a particularly advantageous implementation of the preferred embodiment of the invention, the RF or microwave transistors operating in quadrature are formed on a common semiconductor substrate, as well as in a common package. This makes it possible to use integrated capacitors for compensating the parasitic coupling. It is then a particularly simple matter to set the appropriate value of capacitance during the design and optimization stage, or to adjust the precise value of the compensating capacitors if this is required (for example, by laser trimming of the capacitors).

A transistor arrangement such as that of FIG. 3, having parasitic-coupling compensation according to the present invention, can be used in an RF or microwave amplifier such that the transistors are working in quadrature. The improved matching of the transistors results in increased efficiency of the overall amplifier.

Although the present invention has been described with reference to particular preferred embodiment thereof, it is to be understood that the present invention is not limited by reference to the particularities of the above-described embodiment. More particularly, the skilled person will readily appreciate that modifications and developments can be made in the preferred embodiment without departing from the scope of the invention as defined in the accompanying claims.

For example, in the above-described preferred embodiment of the invention a compensation technique served to compensate for parasitic coupling that manifested itself as a mutual inductance between input bonding wires and output bonding wires of a pair of RF or microwave transistors. However, the proposed technique can be employed to compensate for mutual inductance occurring between other wire areas associated with RF and microwave transistors, notably mutual inductance occurring between circuit elements from matching networks and the like associated with the transistors. This point is illustrated by the following two examples—more examples will readily occur to the skilled person based on his own general knowledge:

the described compensation technique could be used to compensate for mutual inductance occurring between a first parallel inductance that is provided at the output of the first transistor in order to compensate the output capacitance of the first transistor, and a second parallel inductance that is provided at the output of the second transistor (in order to compensate the output capacitance of that second transistor). In that case, the compensation technique can be used to cancel this undesired effect, preferably by connecting a small compensating capacitance between the first and second parallel inductances (so as to have a wideband solution).

the described compensation technique could be used to compensate for mutual inductance occurring between a first inductance (that may be constituted by a wire) of an LC prematch cell that is provided at the input of the first transistor, and a second inductance (which, again, may be constituted by a wire) of an LC circuit of a prematch cell that is provided at the input of the second transistor. In this case, the compensation technique can be used to cancel this undesired effect, preferably by connecting a small compensating capacitance between the first and second inductances.

Moreover, the examples given above concern cases where parasitic coupling arises due to mutual inductance between elements of the first and second transistors themselves (transistor-transistor coupling), or due to mutual inductance arising between circuit elements associated with the respective transistors (associated element-associated element coupling). However, a secondary parasitic coupling may occur between a part of one transistor and a circuit element associated with the other transistor (transistor-associated element coupling). The techniques of the present invention may be used, if desired, to compensate for such a second order coupling.

Furthermore, in the above-described preferred embodiment of the invention, parasitic coupling occurring at both the input side and the output side of a pair of RF or microwave transistors is compensated. However, it is to be understood that advantages are obtained even if parasitic coupling is only compensated at one location (e.g. at only one of the input or output side of the pair of transistors).

Moreover, in the above-described preferred embodiment of the invention, in order to have a wideband solution the compensating capacitors were connected at the location where mutual inductance was manifesting itself, notably between the input bonding wires and the output bonding wires of the pair of RF or microwave transistors. However, once again the skilled person will readily understand that advantages may be obtained even if the compensating capacitor is not at the precise location where the mutual inductance is manifesting itself. Thus, for example, a manufacturer could decide as a matter of course to provide a compensating capacitor between the input bonding wires (and/or output bonding wires) of a pair of RF or microwave transistors provided in a common package, without determining the precise location where parasitic coupling between the transistors was occurring. Such an approach may be workable in an application where a wideband solution is not required.

The invention claimed is:

1. A method of compensating parasitic coupling between a pair of RF or microwave transistors provided in a common package, the method comprising the steps of:
   determining one or more locations where parasitic coupling is operative between the pair of RF or microwave transistors when said transistors are being used in quadrature; and
   connecting a capacitor between the transistors at least one of said one or more locations.

2. The parasitic-coupling compensation method of claim 1, wherein said RF or microwave transistors are formed on a common semiconductor substrate, at least one capacitor is connected between said pair of RF or microwave transistors, and said at least one capacitor comprises an integrated capacitor provided on said semiconductor substrate.

3. The parasitic-coupling compensation method of claim 1, wherein:
   the parasitic coupling occurs between wire areas of the pair of transistors, and
   the connecting step comprises connecting at least one capacitor between a respective wire area of one of said pair of transistors and a wire area of the other of said pair of transistors.

4. The parasitic-coupling compensation method of claim 3, wherein:
   said RF or microwave transistors comprise associated circuit elements,
   the parasitic coupling includes a coupling between a first wire area corresponding to a circuit element associated with one of the pair of transistors and a second wire area corresponding to a circuit element associated with the other of the pair of transistors, and
   the connecting step comprises connecting a capacitor between said first and second wire areas.

5. The parasitic-coupling compensation method of claim 1, wherein the connecting step comprises connecting a first capacitor between the inputs of said pair of RF or microwave transistors and connecting a second capacitor between the outputs of said pair of RF or microwave transistors.

6. A packaged electronic device comprising:
   a pair of RF or microwave transistors; and
   at least one capacitor connected between said pair of transistors;
   wherein said at least one capacitor comprises a capacitor connected between the transistors at least one location where parasitic coupling is operative between the two transistors when the two transistors are being used in quadrature.

7. The packaged electronic device of claim 6, wherein said RF or microwave transistors are formed on a common semiconductor substrate and said at least one capacitor comprises an integrated capacitor provided on said semiconductor substrate.

8. The packaged electronic device of claim 6, comprising a first capacitor connected between the inputs of said pair of RF or microwave transistors and a second capacitor connected between the outputs of said pair of RF or microwave transistors.

9. An RF amplifier comprising a packaged electronic device according to claim 6.

10. A microwave amplifier comprising a packaged electronic device according to claim 6.

11. The parasitic-coupling compensation method of claim 2, wherein:
    the parasitic coupling occurs between wire areas of the pair of transistors, and
    the connecting step comprises connecting at least one capacitor between a respective wire area of one of said pair of transistors and a wire area of the other of said pair of transistors.

12. The parasitic-coupling compensation method of claim 2, wherein the connecting step comprises connecting a first capacitor between the inputs of said pair of RF or microwave transistors and connecting a second capacitor between the outputs of said pair of RF or microwave transistors.

13. The parasitic-coupling compensation method of claim 3, wherein the connecting step comprises connecting a first capacitor between the inputs of said pair of RF or microwave transistors and connecting a second capacitor between the outputs of said pair of RF or microwave transistors.

14. The parasitic-coupling compensation method of claim 4, wherein the connecting step comprises connecting a first capacitor between the inputs of said pair of RF or microwave transistors and connecting a second capacitor between the outputs of said pair of RF or microwave transistors.

15. The packaged electronic device of claim 7, wherein the at least one capacitor further comprises a first capacitor connected between the inputs of said pair of RF or microwave transistors and a second capacitor connected between the outputs of said pair of RF or microwave transistors.

16. An RF amplifier comprising a packaged electronic device according to claim 7.

17. An RF amplifier comprising a packaged electronic device according to claim 8.

18. A microwave amplifier comprising a packaged electronic device according to claim 7.

19. A microwave amplifier comprising a packaged electronic device according to claim 8.

* * * * *